United States Patent [19]

Bertagnolli et al.

[11] Patent Number: 5,358,882
[45] Date of Patent: Oct. 25, 1994

[54] METHOD FOR MANUFACTURING A BIPOLAR TRANSISTOR IN A SUBSTRATE

[75] Inventors: Emmerich Bertagnolli; Helmut Klose, both of Munich, Fed. Rep. of Germany

[73] Assignee: Siemens Aktiengesellschaft, Munich, Fed. Rep. of Germany

[21] Appl. No.: 30,901

[22] Filed: Mar. 15, 1993

[30] Foreign Application Priority Data

Apr. 2, 1992 [DE] Fed. Rep. of Germany ....... 4211050

[51] Int. Cl.$^5$ .......................................... H01L 21/265
[52] U.S. Cl. ....................................... 437/31; 437/162; 437/67; 437/228; 437/909; 148/DIG. 11
[58] Field of Search ....................... 437/31, 162, 61, 62, 437/64, 67, 235, 228, 909; 148/DIG. 10, DIG. 11

[56] References Cited

U.S. PATENT DOCUMENTS 4,994,400 2/1991 Yamaguchi et al. .................. 437/31

FOREIGN PATENT DOCUMENTS 60-198748-A 10/1985 Japan .
3-175639-A 7/1991 Japan .

OTHER PUBLICATIONS

S. M. Sze, VLSI Technology, 2d Ed., McGraw-Hill, 1988, pp. 249 and 261.
W. Bräckelmann, et al., ISSCC Dig. Techn. Papers (1977), "THAM 10.1: A Masterslice LSI For Subnanosecond Random Logic".
A. W. Wieder, Siemens Forschungs-und Entwicklungsberichte, Bd. 13 (1984), Seite 246 ff, "Self-Aligned Bipolar Technology-New Chances for Very-High-Speed Digital Integrated Circuits".
H. Kabza, et al., IEEE Electr. Dev. Lett. Bd. 10 (1989), Seite 344, "A 1-μm Polysilicon Self-Aligning Bipolar Process for Low-Power High-Speed Integrated Circuits".
H. B. Pogge, IEEE BCTM 1990 Conf. Proc., 1990, p. 18, "Trench Isolation Technology".
E. Bertagnolli, et al., IEEE BCTM 1991 Conf. Proc., 1991, p. 34, "Modular Deep Trench Isolation Scheme for 38 GHz Self-Aligned Double Polysilicon Bipolar Devices".
G. P. Li, et al., IEEE El. Dev. Lett., vol. EDL-8 (1987), pp. 338-340, "Bipolar Transistor with Self-Aligned Lateral Profile".
M. W. Geis, et al., IEEE El. Dev. Lett., vol. EDL-8 (1987), pp. 341-343, "High-Temperature Point-Contact Transistors and Schottky Diodes Formed on Synthetic Boron-Doped Diamond".
Wolf et al., "Silicon Processing For The VLSI ERA", vol. 1, pp. 182-184, 1986.

Primary Examiner—Tom Thomas
Assistant Examiner—Tuan Nguyen
Attorney, Agent, or Firm—Hill, Steadman & Simpson

[57] ABSTRACT

A method for producing a bipolar transistor completely surrounded by an insulating trench in a substrate. Insulating regions at the surface of the substrate can be produced by depositing an SiO$_2$ layer on the basis of thermal decomposition of TEOS and subsequent structuring of the SiO$_2$ layer. The insulating regions can be employed as a self-aligning mask for the production of a collector terminal and of a substrate terminal.

8 Claims, 4 Drawing Sheets

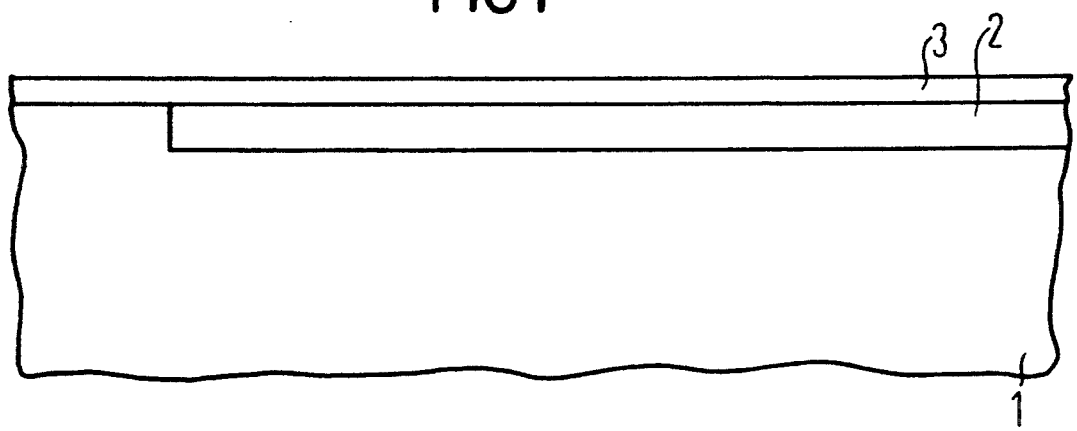
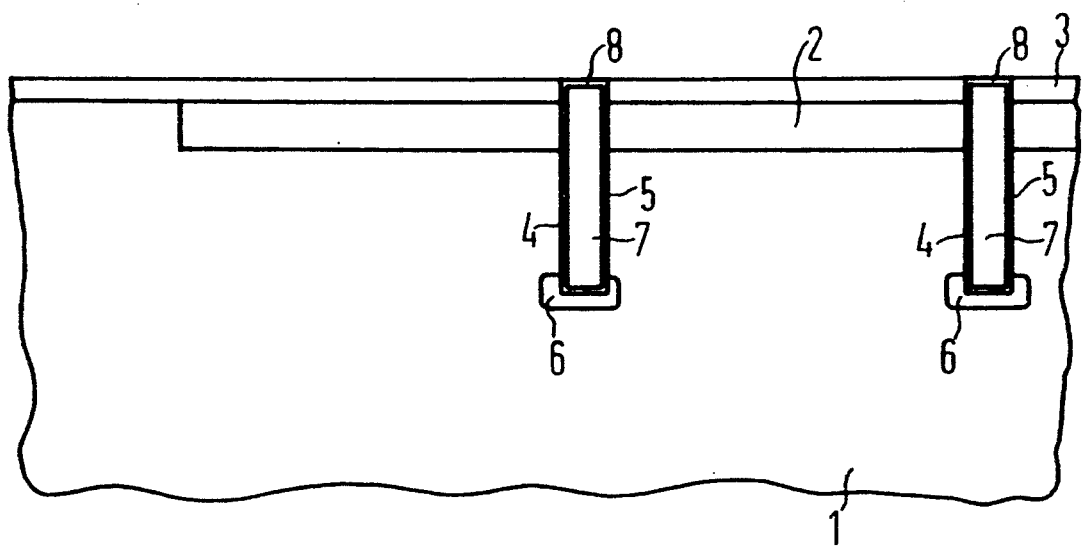

METHOD FOR MANUFACTURING A BIPOLAR TRANSISTOR IN A SUBSTRATE

BACKGROUND OF THE INVENTION

The invention generally relates to the manufacture of bipolar transistors. More specifically, the invention relates to a method of manufacturing a plurality of bipolar transistors on a substrate that are insulated from each other. In this regard, vertical bipolar transistors integrated in a substrate must be electrically insulated from one another.

Bipolar transistors are often manufactured by producing a buried layer (also referred to as a buried collector) in a substrate and subsequently, surface-wide producing an epitaxial layer thereover. The substrate thereby is configured to be of one conductivity type and the buried layer and the epitaxial layer are doped to be of the opposite conductivity type. The bipolar transistor then is constructed in the buried layer and in the epitaxial layer.

Additionally, insulation is produced between neighboring transistors and the insulation between neighboring bipolar transistors must extend deeply enough into the substrate so that the epitaxial layer and the buried layer are separated.

It is known (see, for example, Braekehann et al., ISSCC Dig. Techn. Papers (1977), page 108) to insulate neighboring bipolar transistors from one another by utilizing inhibited pn-junctions. This insulating technique, however, utilizes a great deal of area.

In another insulation technique, the "recessed oxide" process, oxides are introduced and recessed in the substrate, this being known, for example, from A. W. Wieder, Siemens Forschungs-und Entwiklungsberichte, Vol. 13 (1984), pages 246 ff. Given unaltered lithography, the area requirement of the insulation can thereby be reduced to approximately one-third.

A further development of the "recessed oxide" process (see H. Kabza et al., IEEE Electr. Dev. Lett., Vol. 10 (1989), page 344) provides for the introduction of a self-aligned sidewall passivation. In this technique, a planar insulation is realized with noticeably reduced subsequent fabrication steps. Due to under-oxidation and growth suppression of oxides in narrow lithography gaps, however, this technique cannot be arbitrarily miniaturized. Scalability therefore is limited with this technique.

H. B. Pogge, in IEEE BTCM'90, Conf. Proc., 1990, page 18 and E. Bertagnolli et al., in IEEE BCTM'91 Conf. Proc., 1991, page 34, disclose that bipolar transistors can be insulated from one another by providing deep trenches filled with insulating material that surround the transistors. This insulating technique needs no complex subsequent fabrication steps and, therefore, is suitable in the further scaling of bipolar transistors. Insulation regions that define the position of the active transistor region composed of an emitter, base and collector and that define the position of a collector terminal are produced at the surface of the substrate by means of a LOCOS oxidation.

This technology requires noticeably greater process complexity as compared to that of prior technologies. In this regard, approximately 30% more process steps and an additional mask level for the insulation region are required.

The additional mask level is necessary in order to manufacture a substrate contact at the transistor side. This ensues by masked implantation into the epitaxial layer and, potentially, into the buried layer, so that the same conductivity type as in the substrate is produced in the region of the substrate contact.

The temperature stress in the LOCOS oxidation in this process sequence is so high that, first, the buried layer diffuses approximately 0.3 μm deep into the epitaxial layer and, thus, the nominal thickness of the epitaxial layer is reduced by this amount, and that, second, the thermal load cycles limit the yield. Further, the dopant profile of the buried layer is flattened due to the temperature stress, this leading to a loss of performance and scalability of the transistor profiles.

Since the positions of the active transistor regions and of the collector terminal are defined in this process by a LOCOS oxidation, the distance between collector terminal and active transistor region cannot be made arbitrarily small because of the under-oxidation (bird's beak) occurring in the LOCOS oxidation.

SUMMARY OF THE INVENTION

The invention provides a method for manufacturing a bipolar transistor in a substrate that requires an optimally low process outlay and optimally few mask levels and that enables a further vertical and horizontal scaling of the bipolar transistor.

In an embodiment, the invention provides a method for manufacturing a bipolar transistor that is surrounded by an insulating trench wherein:

a bipolar transistor is produced in a substrate;

an insulating trench that completely surrounds the transistor produced in the substrate; a layer of $SiO_2$ is deposited thereover by thermal decomposition of $Si(OC_2H_5)_4$; and the $SiO_2$ layer is restructured to define insulation regions that define regions for an emitter, a base, a collector and a collector terminal within the trench.

In an embodiment, the invention provides that the $SiO_2$ layer is densified by restructuring same at a temperature above the deposition temperature.

In the embodiment, the invention provides that the $SiO_2$ layer is deposited in a thickness between about 200 and 500 mm and at a temperature within the range of 730° C.±300° C. and the $SiO_2$ layer is densified before restructuring by tempering same at a temperature within the range of 800° C.±200° C.

These and other features of the invention are set forth in greater detail below in the following detailed description of the presently preferred embodiments and in the accompanying drawings.

BRIEF DESCRIPTION OF THE DRAWINGS

FIG. 1 illustrates a substrate with a buried layer and a epitaxial layer.

FIG. 2 illustrates the substrate of FIG. 1 after production of trenches.

DETAILED DESCRIPTION OF THE PRESENTLY PREFERRED EMBODIMENTS

Figure 3:
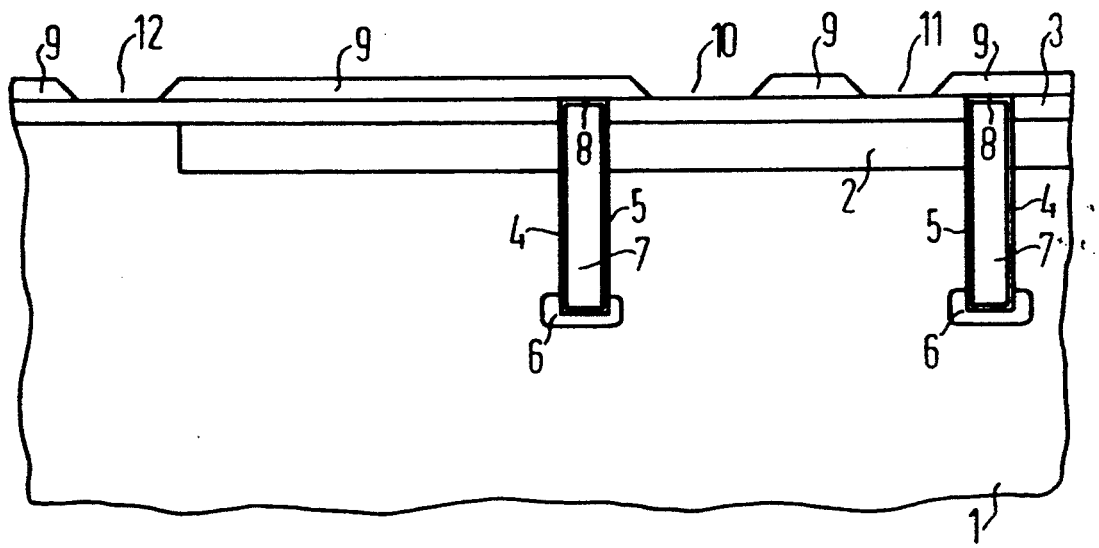
FIG. 3 illustrates the substrate of FIG. 2 after production of insulating regions.

In accordance with a feature of the invention, a bipolar transistor is insulated by an insulating trench that completely surrounds it. Insulation regions are produced at the surface of the substrate by deposition of an $SiO_2$ layer on the basis of thermal decomposition of $Si(OC_2H_5)_4$ (i.e., what is referred to as the TEOS method) and by subsequent structuring of the $SiO_2$ layer. The structuring of the $SiO_2$ layer preferably is accomplished by means of an anisotropic etching step with the assistance of a photoresist mask. The expanse of the insulating regions in a horizontal direction is therefore only limited by the adjustment precision and by the resolution of the photolithography step employed for the manufacture of the photoresist mask.

The $SiO_2$ layer preferably is densified before structuring by tempering of the $SiO_2$ layer before the structuring at a temperature above the deposition temperature, most preferably between 750° C. and 900° C., but otherwise within the range of 800° C.±200° C. and, thus, the quality of the finished insulating regions can be enhanced.

It lies within the framework of the invention to structure the $SiO_2$ layer such that it also defines the position for a substrate terminal outside of the trench in addition to defining the position of an active transistor region for the emitter, base, collector and the position of a collector terminal for the transistor. Upon employment of the insulating regions as an etching mask, the substrate terminal and the collector terminal can be produced by etching off the epitaxial layer in these regions down to the buried layer or, respectively, down to the substrate.

It can be especially advantageous to produce a base terminal and an emitter terminal by deposition and structuring (etching) correspondingly doped polysilicon layers and to simultaneously remove the epitaxial layer in the region of the collector terminal and of the substrate terminal during the anisotropic etching steps for the formation of the base terminal and the emitter terminal. To that end, the etching of the last deposited polysilicon layer—for example, for manufacturing the emitter terminal—is overdrawn (i.e., over-etched) to such an extent that the epitaxial layer is completely removed within the region of the substrate terminal and the collector terminal.

It can be appreciated that the need for two mask levels is avoided by employing the insulating regions as an etching mask for the production of the collector terminal and of the substrate terminal. Over and above this, an overall process for manufacturing a bipolar transistor can be designed wherein high-temperature steps that are implemented at process temperatures above 950° C. are not required. Instead, the number of process steps that are implemented at temperatures between 900° C. and 950° C. is reduced to two. As a result, the dopant profile of the buried layer and of the epitaxial layer is not blurred, so that further vertical scaling of the bipolar transistor and a correspondingly higher performance of the bipolar transistor are enabled.

The method to be described in greater detail below thus can be used both for a self-aligned inside spacer bipolar transistor, as known from A. W. Wieder, Siemens Forschungs- und Entwicklungsberichte, Vo. 13, (1984), pages 246 ff, as well as for an outside spacer bipolar transistor, as known from G. P. Li et al., IEEE El. Dev. Lett., Vol. EDL-8 (1987), page 338.

A more particular description of a presently preferred method follows with reference to the drawings.

In FIG. 1, an $n^+$-doped, buried layer 2 is produced in a substrate 1 of single-crystal, p-doped silicon. This ensues, for example, by implantation with arsenic or antimony with the assistance of a mask composed, for example, of $SiO_2$. The buried layer 2 is laterally limited.

After the removal of the mask employed for the production of the buried layer 2, for example by wet-chemical etching, an $n^-$-doped epitaxial layer 3 is deposited. The epitaxial layer 3 is produced in a thickness of, for example, 0.2 through 0.5 $\mu$m.

Next, an insulating trench is produced that is to surround the finished bipolar transistor. For that purpose, a trench mask, what is referred to as a hard mask, is first produced. To that end, a layer sequence of, for example, thermal silicon oxide, silicon nitride and TEOS silicon oxide in a thickness ratio of, for example, 50 nm/150 nm/600 nm is grown. The trench mask is defined by a photolithography step and is subsequently anisotropically etched (the trench mask is not shown).

As illustrated in FIG. 2, after the removal of a photoresist mask employed in the photolithography step, a trench 4 is etched through the epitaxial layer 3 and through the buried layer 2 into the substrate 1. For example, the trench 4 is etched to a depth of approximately 4.5 $\mu$m. This depth is determined from the thickness of the epitaxial layer 3, the thickness of the buried layer 2 and an allowable residual current under operating conditions.

After the removal of the etching polymers that arise during the trench etching and after a corresponding cleaning, an $SiO_2$ layer 5 is grown at the walls and the floor of the trench in a thickness of, for example, 50 through 100 nm. Subsequently, channel stopper regions 6 are implanted at the floor of the trench 4 by implantation in the substrate 1. The channel stopper regions are intended to prevent the build up of a conductive inversion layer at the substrate/oxide boundary under operating conditions. Subsequently, the trench is filled up by conformal deposition and re-etching of a layer with a filler 7 of, for example, CVD silicon. Instead of being composed of CVD silicon, the filler 7 can also be composed of doped or undoped $SiO_2$.

After re-etching the conformal layer outside the trench region, the trench is dielectrically sealed in the region of the surface of the epitaxial layer 3 with an insulating layer 8, for example a 100 nm thick layer of thermal oxide. Subsequently, the trench mask is removed, so that a residual oxide layer of, for example, approximately 50 nm thick thermal oxide remains at the surface of the wafer.

As illustrated in FIG. 3, for producing insulating regions 9 (see FIG. 3), an $SiO_2$ layer is subsequently deposited in a thickness of, for example, 200 through 500 nm at 730° C. by thermal decomposition of $Si(OC_2H_5)_4$ (TEOS). This $SiO_2$ layer is densified by a tempering step at a temperature above the deposition temperature, for example at 800° C. The position of an active transistor region 10 for the acceptance of emitter, base and collector, the position of a collector terminal 11 and the position of a substrate terminal 12 then are defined by a photolithography step with the assistance of a photoresist mask. The surface of the epitaxial layer in the active transistor region 10, in the region of the collector terminal 11 and of the substrate terminal 12 is exposed by an etching step. The insulating regions 9 are produced from the SiO$_2$ layer in the etching step. The active transistor region 10 and the collector terminal 11 are thereby arranged inside the trench 4. The substrate terminal 12 is arranged outside the trench 4 and to the side of the buried layer 2.

Figure 4:
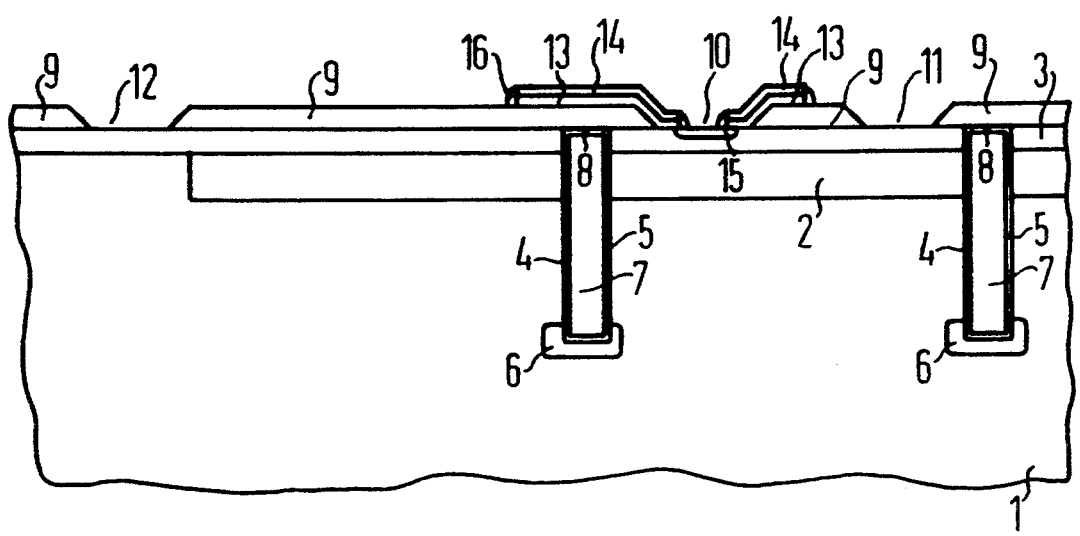
FIG. 4 illustrates the substrate of FIG. 3 after production of a base terminal.

As illustrated in FIG. 4, a base terminal 13 then is produced by surface-wide deposition and anisotropic structuring of a p$^+$-doped polysilicon layer and of a SiO$_2$ layer 14. The base terminal 13 annularly surrounds the active transistor region 10. The base terminal 13 thereby is partially arranged at the surface of the epitaxial layer 3 and the rest is arranged on the neighboring insulating regions 9.

As further illustrated in FIG. 4, an active base 15 is produced by implantation of dopant atoms, for example with 2 through 15 keV boron or BF$_2$, $5 \times 10^{13}$/cm$^2$, using the base terminal 13 and the SiO$_2$ layer 14 as a mask. Alternatively, the active base 15 can also be produced, for example, by a double diffusion technique or by selective epitaxy of a p-doped zone in the active transistor region 10.

It is important in the manufacture of the base terminal 13 that the p$^+$-doped polysilicon layer and the SiO$_2$ layer 14 are completely removed both in the region of the substrate terminal 12 as well as in the region of the collector terminal 11.

Insulating sidewall coverings 16 of SiO$_2$, which are referred to as spacers of SiO$_2$ are then produced at the sidewalls of the base terminal 13 and of the SiO$_2$ layer 14.

Figure 5:
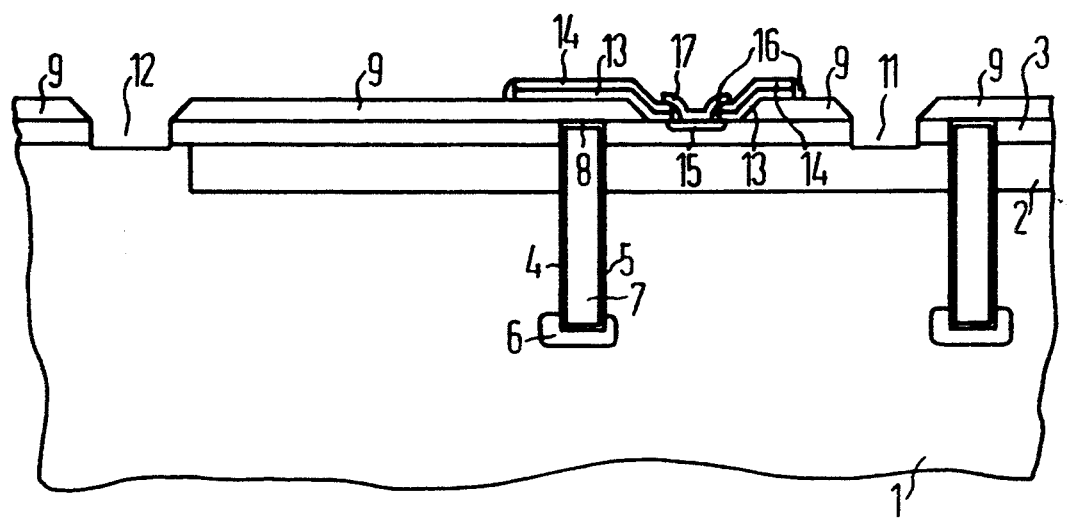
FIG. 5 illustrates the substrate of FIG. 4 after production of an emitter terminal, a collector terminal and a substrate terminal.

As illustrated in FIG. 5, an n$^+$-doped polysilicon layer then is deposited surface-wide, this being structured in an anisotropic etching step with the assistance of a photoresist mask (not shown). An emitter terminal 17 thereby is formed. The emitter terminals 17 covers the surface of the epitaxial layer 3 lying exposed inside the base terminal 13. The emitter terminal 17 is insulated from the base terminal 13 by the SiO$_2$ layer 14 and by the spacers 16.

The anisotropic etching step is over-drawn in the structuring of the n$^+$-doped polysilicon layer for producing the emitter terminal 17. The epitaxial layer 3 thereby is completely removed in the region of the collector terminal 11 and of the substrate terminal 12. The insulating regions 9 act as a mask in this etching. The etching must be over-drawn by approximately 100 to 200%. This is required anyway in order to remove residues of the n$^+$-doped polysilicon layer outside the emitter terminal 17.

By removing the epitaxial layer 3 in the region of the collector terminal, the highly doped, buried layer 2 is uncovered at this location. The substrate 1 is uncovered in the region of the substrate terminal 12 by removing the epitaxial layer 3. As a result, the substrate 1 can be directly contacted from the same side at which the bipolar transistor is arranged. A redoping of the epitaxial layer in this region, which is indispensable in known manufacturing methods, thereby is avoided.

The removal of the epitaxial layer in the region of the substrate terminal 12 and of the collector terminal 11 is possible since the buried layer 2 hardly diffuses out at all into the epitaxial layer 3 due to the above described method. The layer thickness of the epitaxial layer 3 therefore is practically identical in the region of the collector terminal 11 and in the region of the substrate terminal 12.

An etching process that selectively etches polysilicon with respect to silicon oxide is suitable for etching. The silicon oxide erosion 2 of the etching dare not amount to more than 50 nm. A Cl/He plasma, for example, is suitable for this purpose.

The opening of the substrate terminal and of the collector terminal ensues upon employment of the insulating regions 9 as mask. Since no additional phototechnique is required for this purpose, this measure represents a self-alignment version.

Figure 6:
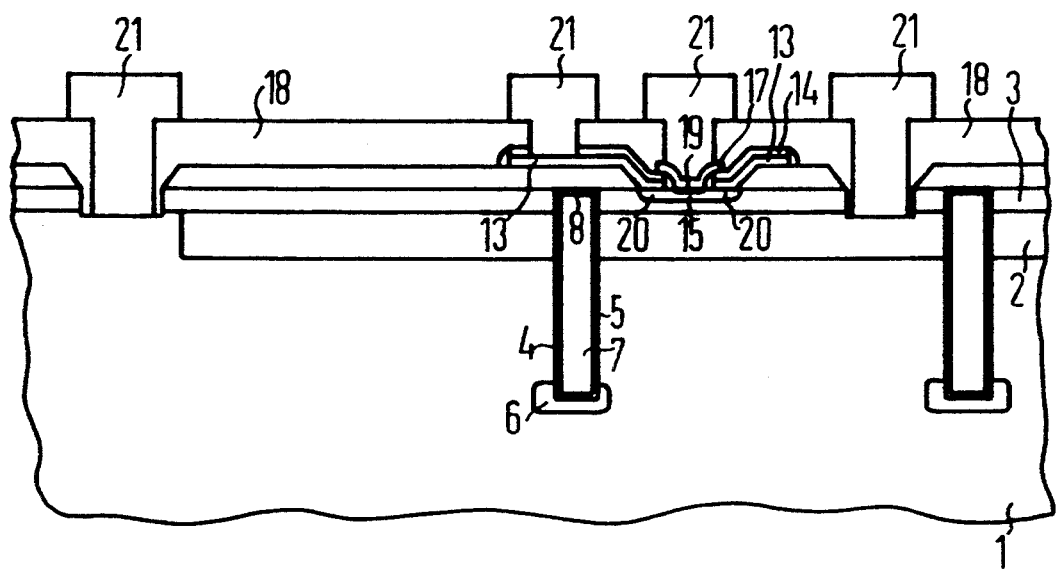
FIG. 6 illustrates a bipolar transistor resulting from the method illustrated in FIGS. 1–5.

As illustrated in FIG. 6, after the end of the etching and an after-treatment for the removal of etching polymers that arose during the etching, an intermediate oxide layer 18 is deposited surface-wide. For example, the intermediate oxide layer 18 is composed of 50 nm TEOS-SiO$_2$ and 800 nm BPSG (boron-phosphorus-silicate glass) (see FIG. 6).

In a tempering step, an emitter 19 is formed by drive-out from the emitter terminal 17 and an inactive base 20 is formed by drive-out from the p$^+$-doped base terminal 13. For example, a rapid thermal annealing (RTA) treatment at 1050° C. over 5 through 15 seconds or an FA treatment at 900° C. for 20 through 30 minutes is suitable as tempering step.

Then, finally, contact holes to the emitter terminal 17, to the base terminal 13, to the collector terminal 11 and to the substrate terminal 12 are opened in a photolithography step. The contact holes are filled with metal terminals 21 of, for example, TiN/AlSiCu.

When a substrate contact is not required at the transistor side, the method of the invention can also be employed only for the self-aligned manufacture of the collector terminal. In this case, the buried layer can be produced surface-wide. One photomask level is thereby eliminated.

Figure 7:
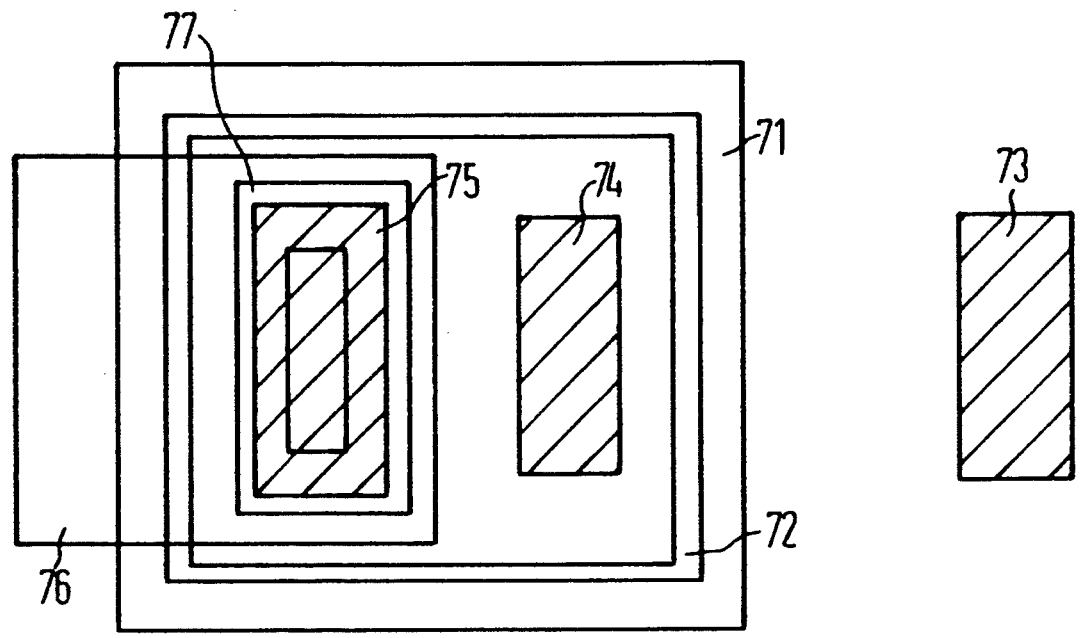
FIG. 7 illustrates a layout for a bipolar transistor having a substrate terminal.

FIG. 7 illustrates a layout of a bipolar transistor having a substrate contact at the transistor side. The bipolar transistor is completely surrounded by an insulating trench 71. The buried layer 72 is arranged inside the insulating trench 71. A substrate terminal 73 is arranged outside the insulating trench. A collector terminal 74 and an active transistor region 75 are arranged inside the insulating trench 71. Emitter and base are arranged in the active transistor region 75. The base is annularly connected by a base terminal 76 of p$^+$-doped silicon. The emitter is connected by an emitter terminal 77 of n$^+$-doped polysilicon.

Figure 8:
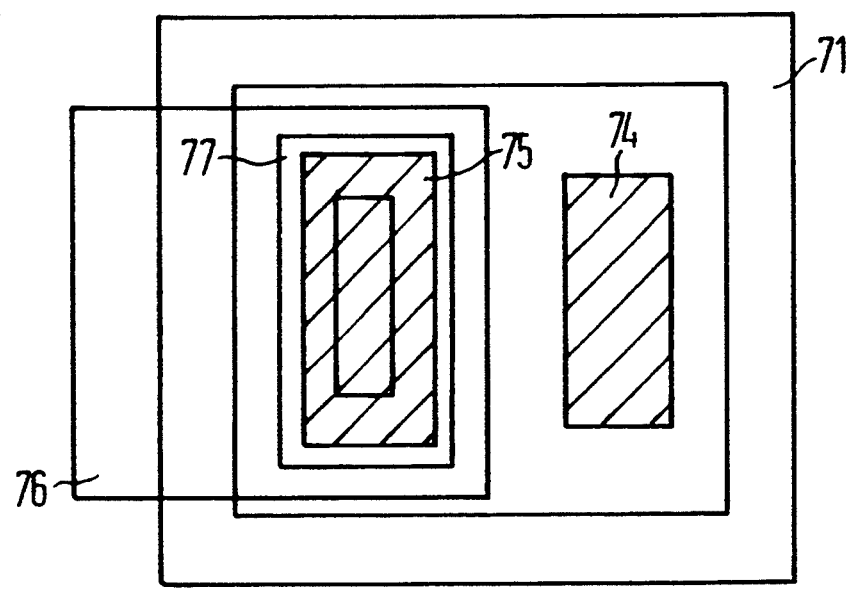
FIG. 8 illustrates a layout for a bipolar transistor without a substrate terminal.

FIG. 8 illustrates a layout for the bipolar transistor without a substrate contact at the transistor side. For the sake of clarity, the same reference characters as were used in FIG. 7 are employed in FIG. 8. In this embodiment, the buried layer is applied surface-wide.

The above description invention has been set forth with reference to npn bipolar transistors. However, it can be appreciated that it can likewise be employed for pnp bipolar transistors.

While preferred embodiments have been shown and described, modifications and changes may become apparent to those skilled in the art which shall fall within the spirit and scope of the invention. It is intended that such modifications and changes be covered by the attached claims.

We claim:

1. A method for forming a bipolar transistor in a substrate of a first conductivity type, comprising the steps of:

forming in the substrate a buried layer of a conductivity type opposite that of the substrate;

forming over the substrate an epitaxial layer of the same conductivity type as that of the buried layer;

forming in the epitaxial layer, the buried layer and the substrate an insulating trench which surrounds a region in which the bipolar transistor is to be formed;

depositing surface wide a layer of $SiO_2$ by means of thermal decomposition of $Si(OC_2H_5)_4$ at a deposition temperature;

forming an active transistor region for a base, collector and emitter and a collector terminal region within the region surrounded by the insulating trench by appropriate etching of the $SiO_2$ layer down to the epitaxial layer, the unetched portions of the $SiO_2$ layer forming insulating regions;

forming a base terminal and an emitter terminal by operative deposition and anisotropic etching of first and second, respectively, doped polysilicon layers, the anisotropic etching being selective relative to the insulating regions, the anisotropic etching of one of the doped polysilicon layers being overetched to the extent necessary to etch out the epitaxial layer down to the buried layer within the collector terminal region; and forming a collector terminal with the collector terminal region.

2. A method according to claim 1, wherein the $SiO_2$ layer is densified before the etching by tempering same at a temperature above the deposition temperature.

3. A method according to claim 1, wherein the $SiO_2$ layer is deposited in a thickness between about 200 and 500 nm and at a temperature within the range $730° C. \pm 300°$; and whereby the $SiO_2$ layer is densified by tempering at a temperature within the range $800° C. \pm 200°$.

4. A method according to claim 1, wherein the insulating trench is produced by a masked anisotropic trench etching and a subsequent filing of the trench, whereby the filling comprises insulating material covering at least walls and a floor of the trench.

5. A method according to claim 1,
wherein the buried layer is formed by masked implantation such that it is laterally limited and laterally overlaps the region in which the bipolar transistor is to be formed; and
wherein a substrate terminal region is formed outside of the buried layer outside the trench simultaneously with the formation of the active transistor region and collector terminal region by similar etching of the $SiO_2$ layer down to the epitaxial layer.

6. A method according to claim 5, wherein an etching through the epitaxial layer to the substrate ensues simultaneously in the substrate terminal region during the anisotropic etching for the formation of the base terminal and the emitter terminal.

7. A method according to claim 1,
wherein the step of forming the base terminal includes etching the first doped polysilicon layer so that it is completely removed outside the base terminal;
wherein the base terminal has sidewalls that are provided with insulating sidewall covers of $SiO_2$;
wherein the base terminal is provided with an insulating layer of $SiO_2$; and
wherein the anisotropic etching of a second doped polysilicon layer to produce the emitter terminal is selective with respect to the $SiO_2$ sidewall covers of the base terminal.

8. A method according to claim 1,
wherein the buried layer is produced by masked ion implantation in the substrate;
wherein the trench is produced by anisotropic etching into the substrate using a trench mask;
wherein a floor and walls of the trench are provided with a $SiO_2$ layer;
wherein channel stopper regions of the same conductivity type of the buried layer are formed under the trench in the substrate by implantation;
wherein the trench is filled with a conformal layer by deposition and re-etching;
wherein the trench is sealed with an insulating layer;
wherein the base terminal is produced by deposition and anisotropic etching with the assistance of a photoresist mask so as to be annular, the first doped polysilicon layer being doped to have the same conductivity type of the substrate;
wherein an active base is formed within the active transistor region by implantation, using the base terminal provided with a $SiO_2$ layer as a mask;
wherein insulating spacers are produced at sidewalls of the base terminal;
wherein an emitter terminal is produced by deposition and anisotropic etching with the assistance of a photoresist mask, the second doped polysilicon layer being doped to have the same conductivity type of the buried layer;
wherein an inactive base is formed in a tempering step by drive-out from the base terminal, and an emitter that is annularly surrounded by the inactive base is formed by drive-out from the emitter terminal;
wherein contact holes to the base terminal, emitter terminal and collector terminal are opened in a planarizing intermediate oxide layer and are provided with metal terminals.

* * * * *